(12) United States Patent
Xie et al.

(10) Patent No.: US 11,177,370 B2
(45) Date of Patent: Nov. 16, 2021

(54) VERTICAL FIELD EFFECT TRANSISTOR WITH SELF-ALIGNED SOURCE AND DRAIN TOP JUNCTION

(71) Applicant: International Business Machines Corporation, Armonk, NY (US)

(72) Inventors: Ruilong Xie, Niskayuna, NY (US); Chun-Chen Yeh, Danbury, CT (US); Alexander Reznicek, Troy, NY (US); Chen Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/805,346

(22) Filed: Feb. 28, 2020

(65) Prior Publication Data
US 2021/0273077 A1   Sep. 2, 2021

(51) Int. Cl.
| | |
|---|---|
| *H01L 29/66* | (2006.01) |
| *H01L 21/8238* | (2006.01) |
| *H01L 29/417* | (2006.01) |
| *H01L 29/16* | (2006.01) |
| *H01L 29/08* | (2006.01) |
| *H01L 29/78* | (2006.01) |

(52) U.S. Cl.
CPC ........ *H01L 29/66666* (2013.01); *H01L 21/823814* (2013.01); *H01L 21/823885* (2013.01); *H01L 29/0847* (2013.01); *H01L 29/1604* (2013.01); *H01L 29/1608* (2013.01); *H01L 29/41741* (2013.01); *H01L 29/7827* (2013.01)

(58) Field of Classification Search
CPC ........... H01L 29/66666; H01L 29/1604; H01L 29/0847; H01L 29/41741; H01L 29/7827; H01L 29/1608; H01L 21/823885; H01L 21/823814
USPC ........................................................ 257/329
See application file for complete search history.

(56) References Cited

U.S. PATENT DOCUMENTS 5,252,849 A * 10/1993 Fitch .................. H01L 21/8221
  257/329
8,647,947 B2   2/2014 Masuoka
(Continued)

OTHER PUBLICATIONS

"Low Contact Resistance Top S/D for VTFET", An IP.com Prior Art Database Technical Disclosure, Disclosed Anonymously, IP.com No. IPCOM000255779D, IP.com Electronic Publication Date: Oct. 12, 2018, 7 pages.

*Primary Examiner* — Mohammad M Hoque
(74) *Attorney, Agent, or Firm* — Michael A. Petrocelli

(57) ABSTRACT

A semiconductor structure, and a method for forming the same includes an amorphous semiconductor layer in contact with a top surface of a channel fin extending vertically from a bottom source/drain located above a substrate. A hard mask memorization layer is formed directly above the amorphous semiconductor layer, portions of the amorphous semiconductor layer in contact with the top surface of the channel fin are recrystallized forming recrystallized regions. The amorphous semiconductor layer is selective removed and a second dielectric layer is deposited to form a top spacer. The hard mask memorization layer and the recrystallized regions are removed, and a first epitaxial region is formed above the channel fin followed by a second epitaxial region positioned above the first epitaxial region and between the second dielectric layer forming a top source/drain of the semiconductor structure.

5 Claims, 15 Drawing Sheets

(56) References Cited

U.S. PATENT DOCUMENTS

| | | |
|---|---|---|
| 9,041,086 B2 | 5/2015 | Lindholm |
| 9,773,708 B1 | 9/2017 | Zhang |
| 9,935,018 B1* | 4/2018 | Xie ................. H01L 21/823885 |
| 10,199,464 B2 | 2/2019 | Cheng |
| 2011/0303985 A1* | 12/2011 | Masuoka .......... H01L 29/78642 |
| | | 257/369 |
| 2018/0083136 A1* | 3/2018 | Xie ................... H01L 29/42392 |
| 2018/0097000 A1 | 4/2018 | Bi |
| 2018/0204950 A1 | 7/2018 | Cheng |
| 2018/0254330 A1 | 9/2018 | Bao |
| 2018/0331213 A1 | 11/2018 | Bentley |
| 2020/0176584 A1* | 6/2020 | Wu ..................... H01L 29/7854 |

* cited by examiner

VERTICAL FIELD EFFECT TRANSISTOR WITH SELF-ALIGNED SOURCE AND DRAIN TOP JUNCTION

BACKGROUND

The present invention generally relates to the field of semiconductor devices, and more particularly to a method of forming self-aligned source and drain top junctions in vertical field-effect transistors (VFETs).

VFETs have been pursued as a potential device option for scaling complementary metal-oxide semiconductors (CMOS) to the 5 nanometer (nm) node and beyond. As opposed to planar CMOS devices, VFETs are oriented vertically with a vertical fin or nanowire that extends upward from the substrate. The fin or nanowire forms the channel region of the transistor. A source region and a drain region are situated in electrical contact with the top and bottom ends of the channel region, while the gate is disposed on one or more of the fin or nanowire sidewalls. Thus, in VFETs the direction of the current flow between the source and drain regions is normal to the main surface of the substrate.

Generally, VFET's top source and drain junction is defined during late metal gate recess and reactive ion etching (RIE) of top spacers. However, forming a good junction overlap of the top source and drain terminal to the gate can be difficult due to thinning of the high-k gate dielectric and associated reliability issues. Therefore, improved techniques for forming the top source and drain junction of vertical field effect transistors would be desirable.

SUMMARY

Shortcomings of the prior art are overcome and additional advantages are provided through the provision of a method for forming a semiconductor structure that includes forming an amorphous semiconductor layer in contact with a top surface of a channel fin extending vertically from a bottom source/drain located above a substrate, in contact with a top surface of a high-k metal gate stack located around the channel fin, and in contact with a top surface of a first dielectric layer located directly above the high-k metal gate stack. A hard mask memorization layer is formed directly above the amorphous semiconductor layer and portions of the amorphous semiconductor layer in contact with the top surface of the channel fin are recrystallized to form recrystallized regions. The remaining portions of the amorphous semiconductor layer are removed and a second dielectric layer is deposited to form a top spacer. The hard mask memorization layer and the recrystallized regions are removed from the semiconductor structure, and a first epitaxial region is formed above the channel fin followed by a second epitaxial region located above the first epitaxial region and between the second dielectric layer, the first epitaxial region and the second epitaxial region comprising a top source/drain of the semiconductor structure.

Another embodiment of the present disclosure provides a semiconductor structure that includes a first epitaxial region in contact with a top surface of a channel fin extending vertically from a bottom source/drain located above a substrate, a second epitaxial region above the first epitaxial region. The second epitaxial region has a horizontal thickness that is larger than a horizontal thickness of the first epitaxial region. The first epitaxial region and the second epitaxial region form a top source/drain of the semiconductor structure, and a top spacer adjacent to the first epitaxial region and the second epitaxial region. The top spacer is in contact with a top surface of a high-k metal gate stack located around the channel fin, and in contact with a top surface of a first dielectric layer located directly above the high-k metal gate stack.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1A:
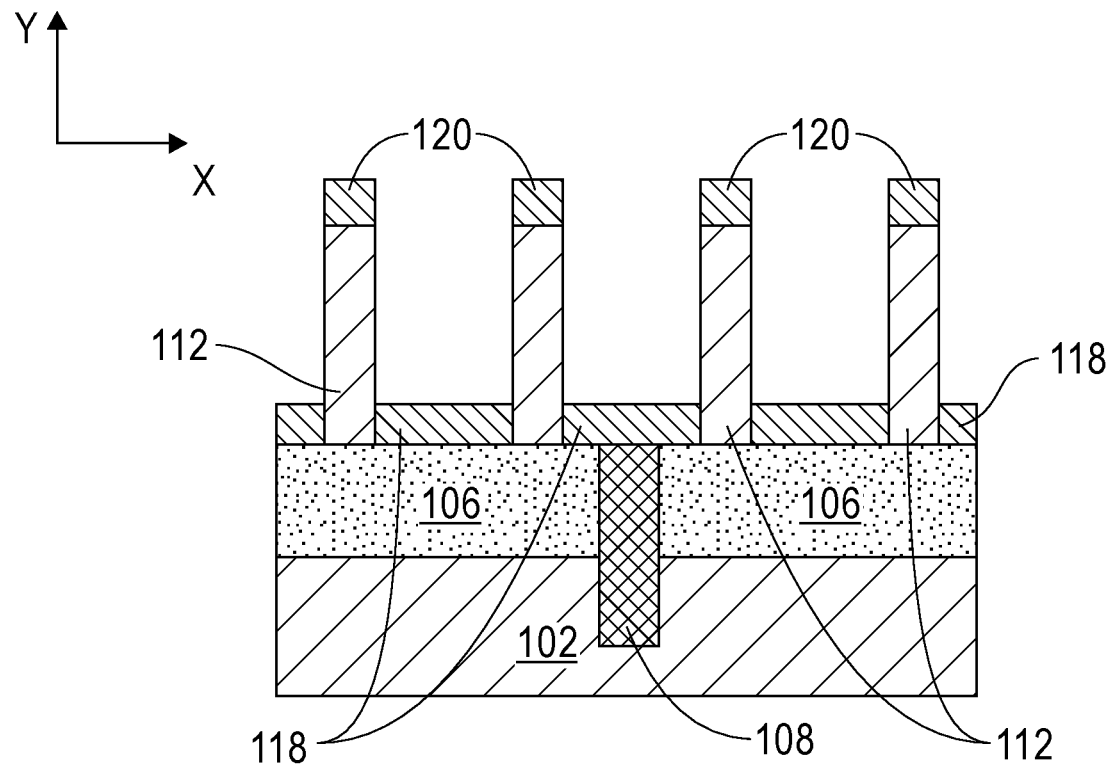
FIG. 1A is a cross-sectional view of a semiconductor structure at an intermediate step during the manufacturing process, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Some non-planar transistor device architectures, such as VFETs, employ semiconductor fins and side-gates that can be contacted outside the active region, resulting in increased device density over lateral devices. In VFETs the source to drain current flows in a direction that is perpendicular to a major surface of the substrate. For example, in a known VFET configuration a major substrate surface is horizontal and a vertical fin extends upward from the substrate surface. The fin forms the channel region of the transistor. A source region and a drain region are situated in electrical contact with the top and bottom ends of the channel region, while a gate is disposed on one or more of the fin sidewalls. A bottom junction is formed at the interface between the channel fin and the bottom source/drain (S/D) region, and a top junction is formed at the interface between the channel fin and the top S/D region.

Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which consists of a contact between a p-type piece of silicon, rich in holes, and an n-type piece of silicon, rich in electrons. N-type and p-type FETs are formed by implanting different types of dopants to selected regions of the device to form the necessary junction(s). N-type devices can be formed by implanting arsenic (As) or phosphorous (P), and p-type devices can be formed by implanting boron (B).

If the gate does not sufficiently laterally overlap the top and bottom S/D junctions, external resistance is increased and overall transistor performance is degraded. In known VFET fabrication operations, the fin is recessed, and the top S/D region is formed on the recessed fin using an in-situ doped epitaxial growth process. The fin must be recessed to a sufficient depth that the top S/D junction laterally overlaps the gate. The gate dielectric is exposed to the etchant used to recess the fin, which can cause potential thinning of the gate dielectric and contamination of the epitaxy tool. If the fin recessed is limited to limit damage to the gate dielectric, the fin will not be recessed to a sufficient depth, and the top S/D junction will laterally underlap the gate, which increases external resistance and degrades overall transistor performance.

Therefore, embodiments of the present invention provides a method and associated structure for forming a VFET device with a self-aligned top S/D junction that guarantees lateral overlap of the gate without thinning of the high-k gate dielectric. More specifically, embodiments of the present invention provide a self-aligned top junction recrystallization process to accurately define the top S/D junction. An embodiment by which the VFET device with self-aligned top S/D junction can be formed is described in detailed below by referring to the accompanying drawings in FIGS. 1A-14B.

Figure 1B:
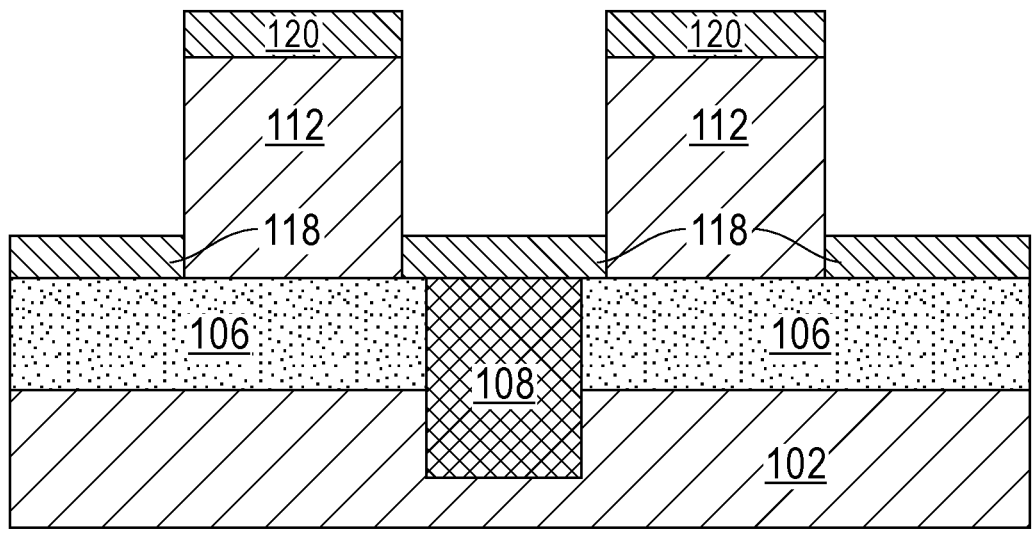
FIG. 1B is a lateral view of the semiconductor structure taken along the Y-plane.

Referring now to FIG. 1A, a cross-sectional view of a semiconductor structure 100 is shown, according to an embodiment of the present disclosure. In this embodiment, FIG. 1B is a lateral view of the semiconductor structure 100 taken along the Y-axis, specifically along a channel fin 112. Known semiconductor fabrication operations have been used to form the semiconductor structure 100 having a substrate 102, a bottom S/D region 106 across from a major surface of the substrate 102, a channel fin 112, a hard mask 120, a bottom spacer 118, a shallow trench isolation region (STI) 108 configured and arranged as shown. The various elements that form the semiconductor structure 100 extend along a first axis (e.g., X-axis) to define width dimensions, and extend along a second axis (e.g., Y-axis) perpendicular to the X-axis to define height (or thickness) dimensions. Although not specifically depicted in the cross-sectional views shown in FIGS. 1A-1B, the various elements that form the semiconductor structure 100 also extend along a third axis (e.g., Z-axis) perpendicular to the first axis and the second axis to define depth dimensions. In accordance with standard VFET architectures, various elements of the semiconductor structure 100 (e.g., bottom spacer 118, high-k metal gate stack 206, etc.) extend completely around the sidewalls of the channel fin 112 in the X, Y, and Z directions.

With continued reference to FIGS. 1A-1B, the hard mask 120 can be deposited over the substrate 102, followed by the formation of the channel fin 112 using patterning techniques such as SADP or SAQP processes. The substrate 102 can be any suitable substrate material, such as, for example, monocrystalline Si, SiGe, SiC, III-V compound semiconductor, II-VI compound semiconductor, or semiconductor-on-insulator (SOI). In some embodiments, the substrate 102 includes a buried oxide layer (not depicted). In some embodiments, the bottom S/D region 106 can be formed before the channel fin 112. In some embodiments, the bottom S/D region 106 is epitaxially grown after formation of the channel fin 112, and the necessary doping to form the bottom S/D region 106 is provided through in-situ doping during the epitaxial growth process, or through ion implantation after the bottom S/D region 106 is formed. The bottom S/D region 106 can be formed by any suitable doping technique, including but not limited to, ion implantation, gas phase doping, plasma doping, plasma immersion ion implantation, cluster doping, infusion doping, liquid phase doping, solid phase doping, in-situ epitaxy growth, or any suitable combination of those techniques.

Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, germanium, and/or carbon doped silicon (Si:C) can be doped during deposition (in-situ doped) by adding dopants, n-type dopants (e.g., phosphorus or arsenic) or p-type dopants (e.g., boron or gallium), depending on the type of transistor. The dopant concentration in the bottom S/D region 106 can range from $1 \times 10^{19}$ cm$^{-3}$ to $2 \times 10^{21}$ cm$^{-3}$, or preferably between $2 \times 10^{20}$ cm$^{-3}$ and $1 \times 10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments of the invention, epitaxial growth and/or deposition processes are selective to forming on semiconductor surface, and generally do not deposit material on exposed surfaces, such as silicon dioxide or silicon nitride surfaces.

In some embodiments of the invention, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

With continued reference to FIGS. 1A-1B, the channel fin 112 can be electrically isolated from other regions of the substrate 102 by the shallow trench isolation 108. The shallow trench isolation 108 can be made of any suitable dielectric material, such as, for example, a silicon oxide.

Bottom spacers 118 are formed across from the doped S/D region 106 and adjacent to a bottom portion of the channel fin 112. The bottom spacers 118 can include a dielectric material, such as, for example, SiN, SiC, SiOC, SiCN, BN, SiBN, SiBCN, SiOCN, SiOxNy, and combinations thereof. The dielectric material can be a low-k material having a dielectric constant less than about 7, less than about 5, or even less than about 2.5. The bottom spacers 118 can be formed using combinations of known deposition and etching processes, such as, for example, CVD, PECVD, ALD, PVD, chemical solution deposition, and etching processes including RIE, wet etch, or isotropic vapor phased dry etch.

Figure 2A:
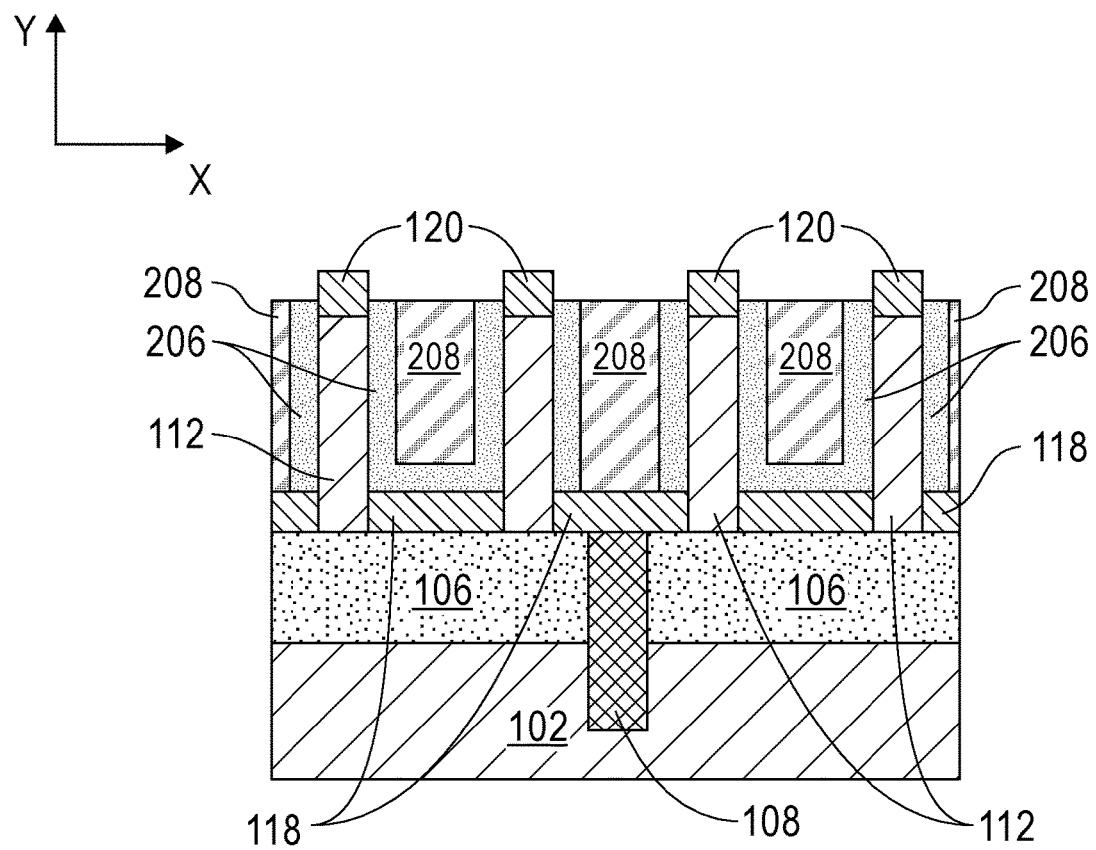
FIG. 2A is a cross-sectional view of the semiconductor structure after formation of a high-k metal gate stack, according to an embodiment of the present disclosure.
Figure 2B:
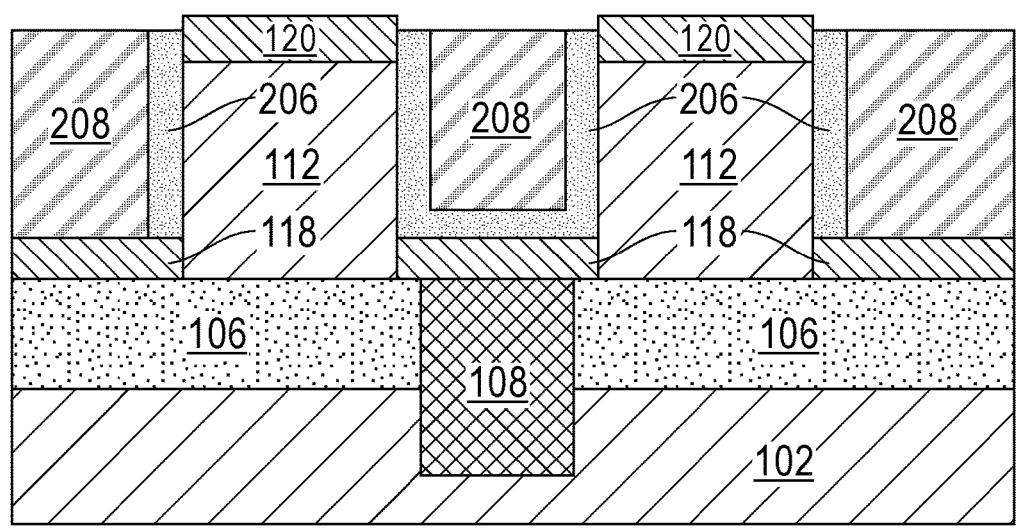
FIG. 2B is a lateral view of the semiconductor structure taken along the Y-plane.

Referring now to FIG. 2A, a cross-sectional view of the semiconductor structure 100 after formation of a high-k metal gate stack 206 is shown, according to an embodiment of the present disclosure. In this embodiment, FIG. 2B is a lateral view of the semiconductor structure 100 taken along the Y axis.

For ease of illustration, the high-k metal gate stack 206 is depicted as only one layer. However, as known by those skilled in the art, the high-k metal gate stack 206 may include a gate dielectric and a gate conductor/metal (e.g., a work function metal (WFM)) deposited over the bottom spacer 118 and adjacent to a portion of the channel fin 112. In some embodiments, the high-k metal gate stack 206 is deposited by ALD.

The gate dielectric (not shown) can be formed from one or more gate dielectric films. The gate dielectric films can be a dielectric material having a dielectric constant greater than, for example, 3.9, 7.0, or 10.0. Non-limiting examples of suitable materials for the high-k dielectric films include oxides, nitrides, oxynitrides, silicates (e.g., metal silicates), aluminates, titanates, nitrides, or any combination thereof. Examples of high-k materials with a dielectric constant greater than 7.0 include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric films can further include dopants such as, for example, lanthanum and aluminum. The gate dielectric films can be formed by suitable deposition processes, for example, CVD, PECVD, ALD, PVD, chemical solution deposition, or other like processes. The thickness of the gate dielectric films can vary depending on the deposition process as well as the composition and number of high-k dielectric materials used.

The gate conductor (not shown) in the high-k metal gate stack 206 can include doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments, the gate conductor can be a WFM deposited over the gate dielectric films by a suitable deposition process, for example, CVD, PECVD, PVD, plating, thermal or e-beam evaporation, and sputtering. The type of WFM depends on the type of transistor and can differ between n-FET and p-FET devices. P-type WFMs include compositions such as titanium nitride (TiN), ruthenium, palladium, platinum, cobalt, nickel, and conductive metal oxides, or any combination thereof. N-type WFMs include compositions such as titanium carbide (TiC), titanium aluminum carbide (TiAlC), hafnium, zirconium, titanium, tantalum, aluminum, metal carbides (e.g., hafnium carbide, zirconium carbide, titanium carbide, and aluminum carbide), aluminides, or any combination thereof. The gate conductor can further include a tungsten (W), titanium (Ti), aluminum (Al), cobalt (Co), or nickel (Ni) material over the WFM layer of the gate conductor 212. The gate conductor can be deposited by a suitable deposition process, for example, CVD, PECVD, PVD, plating, thermal or e-beam evaporation, and sputtering.

In this embodiment, the high-k metal gate stack 206 is conformally deposited on the semiconductor structure 100. After deposition of the high-k metal gate stack 206, a patterning process is conducted on the semiconductor structure 100 to etch the unwanted high-k metal gate stack 206.

In a subsequent processing step, an organic planarization layer (OPL) 208 is deposited on the high-k metal gate stack 206 followed by recessing the OPL to expose a top region of the high-k metal gate stack 206, followed by an isotropic etching process to remove the exposed high-k metal gate stack 206 located over the hard mask 120, as shown in the figures. In an embodiment, the OPL 208 can be deposited by spin-on coating. After the OPL overfill, the OPL 208 is recessed using any suitable method known in the art, such as RIE. Subsequently, exposed portions of the high-k metal gate stack 206 are removed from the semiconductor structure 100.

Figure 3A:
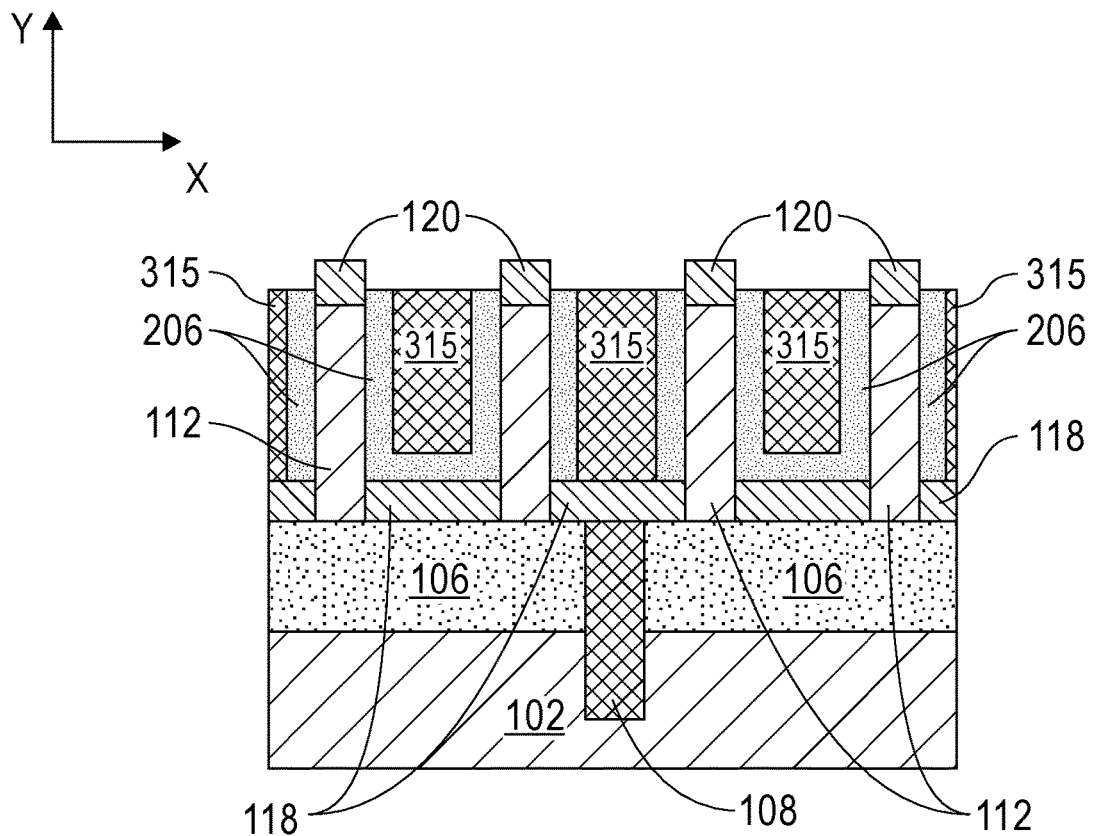
FIG. 3A is a cross-sectional view of the semiconductor structure after deposition of a first dielectric layer, according to an embodiment of the present disclosure.
Figure 3B:
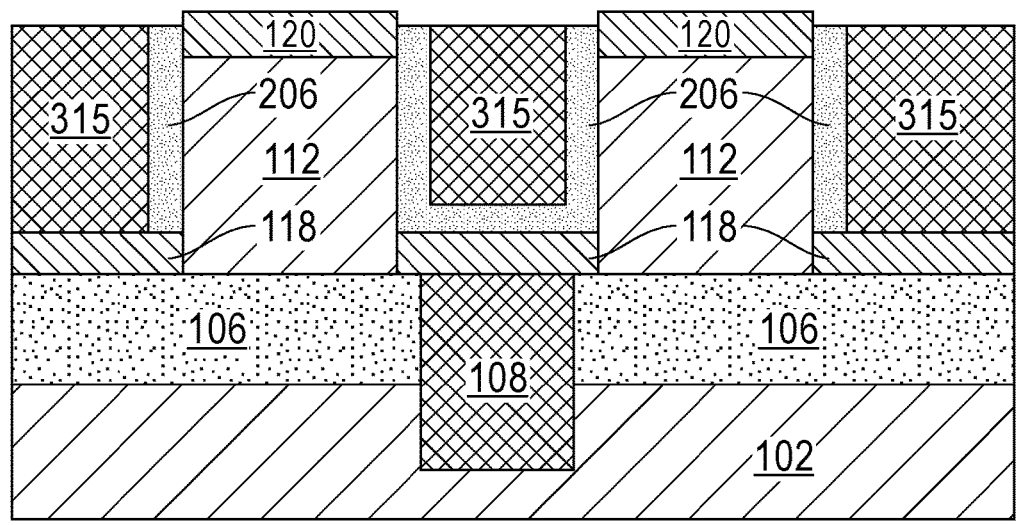
FIG. 3B is a lateral view of the semiconductor structure taken along the Y-plane.

Referring now to FIG. 3A, a cross-sectional view of the semiconductor structure 100 after removing the OPL 208 is removed and deposition of a first dielectric layer 315 is shown, according to an embodiment of the present disclosure. In this embodiment, FIG. 3B is a lateral view of the semiconductor structure 100 taken along the Y-axis.

According to an embodiment, the OPL 208 may be removed by, for example, an ashing technique. The first dielectric layer 315 may include, for example, a dielectric material having a dielectric constant, k, in the range of approximately 2.0 to approximately 7.0, which may be deposited on the semiconductor structure 100 by any suitable deposition process such as, CVD. A chemical mechanical polishing (CMP) can be conducted on the semiconductor structure 100 to planarize the first dielectric layer 315. As known by those skilled in the art, the planarization process is performed until reaching the hard mask 120.

Figure 4A:
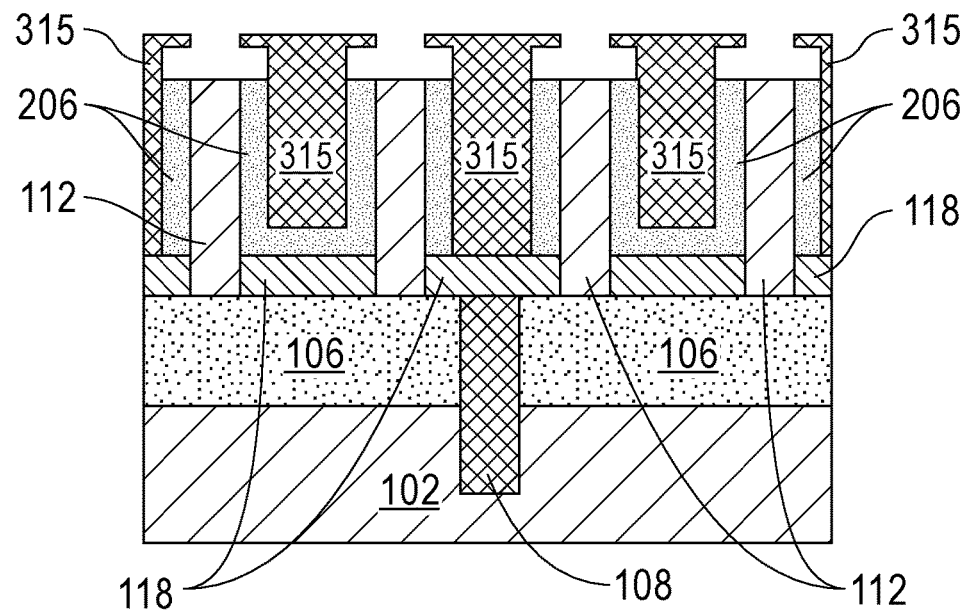
FIG. 4A is a cross-sectional view of the semiconductor structure after hard mask removal, according to an embodiment of the present disclosure.
Figure 4B:
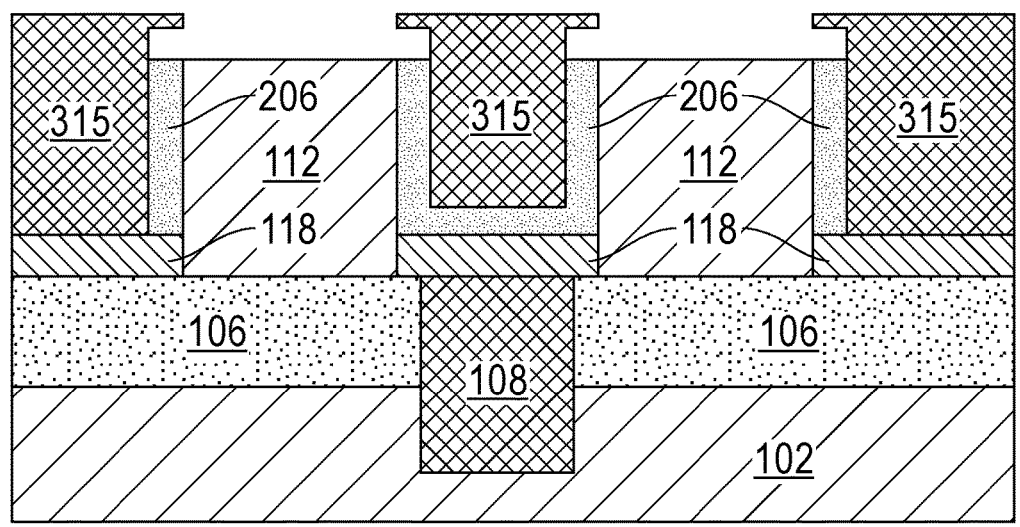
FIG. 4B is a lateral view of the semiconductor structure taken along the Y-plane.

Referring now to FIG. 4A, a cross-sectional view of the semiconductor structure 100 after removal of the hard mask 120 is shown, according to an embodiment of the present disclosure. In this embodiment, FIG. 4B is a lateral view of the semiconductor structure 100 taken along the Y-axis.

In this embodiment, the hard mask 120 is removed by using an isotropic etch process in which the etching occurs in lateral and vertical directions. After removing the hard mask 120, exposed portions of the high-k metal gate stack 206 are also removed using, for example, an isotropic etch process. Non-limiting examples of isotropic etch processes suitable to remove the hard mask 120 and the high-k metal gate stack 206 include hot phosphorous wet etch, isotropic vapor phased dry etch, and the like. After the isotropic etch, top surfaces of the high-k metal gate stack 206 and top surfaces of the channel fin 112 are exposed, as illustrated in the figures.

Figure 5A:
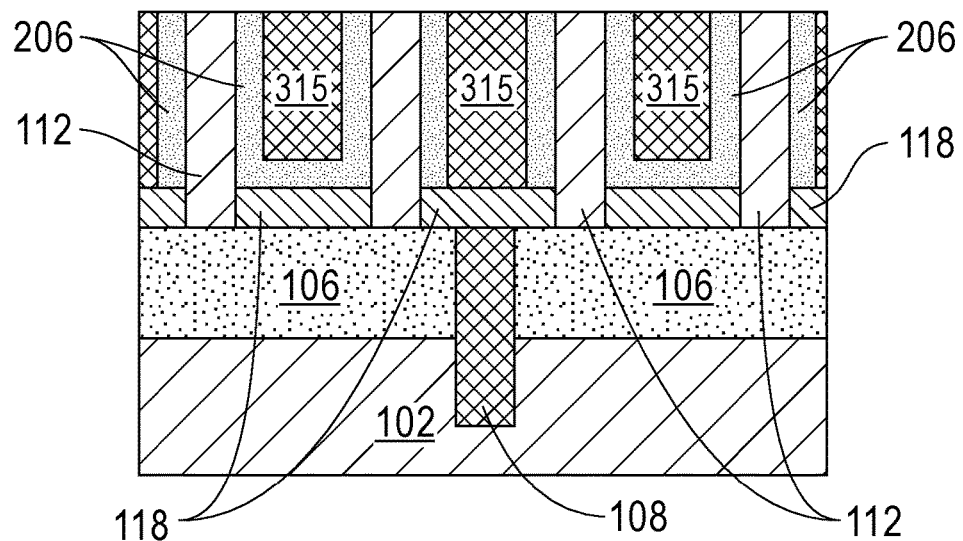
FIG. 5A is a cross-sectional view of the semiconductor structure after a planarization process, according to an embodiment of the present disclosure.
Figure 5B:
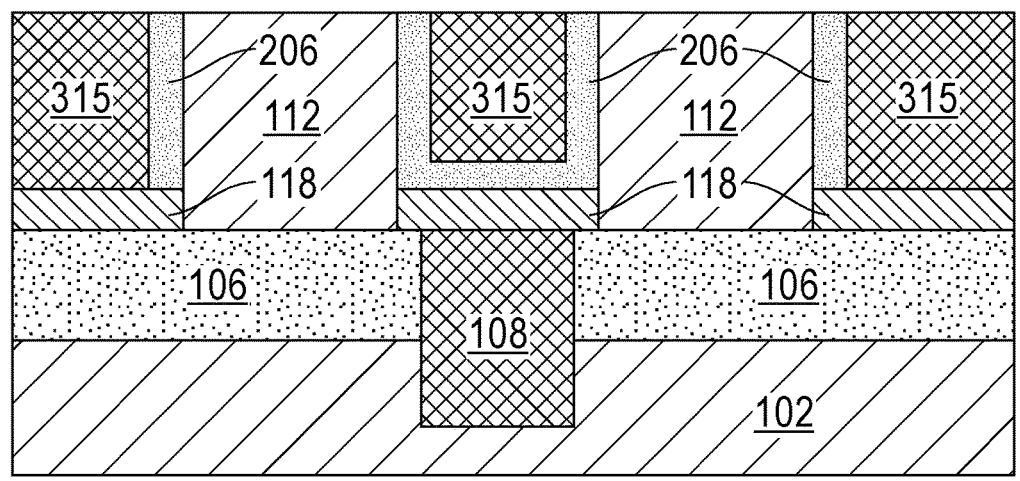
FIG. 5B is a lateral view of the semiconductor structure taken along the Y-plane.

Referring now to FIG. 5A, a cross-sectional view of the semiconductor structure 100 after a planarization process is shown, according to an embodiment of the present disclosure. In this embodiment, FIG. 5B is a lateral view of the semiconductor structure 100 taken along the Y-axis.

A planarization process such as CMP is performed on the semiconductor structure 100 to planarize and polish top surfaces of the semiconductor structure 100, as shown in the figure. As known by those skilled in the art, an oxide fill is typically performed before the planarization step.

Figure 6A:
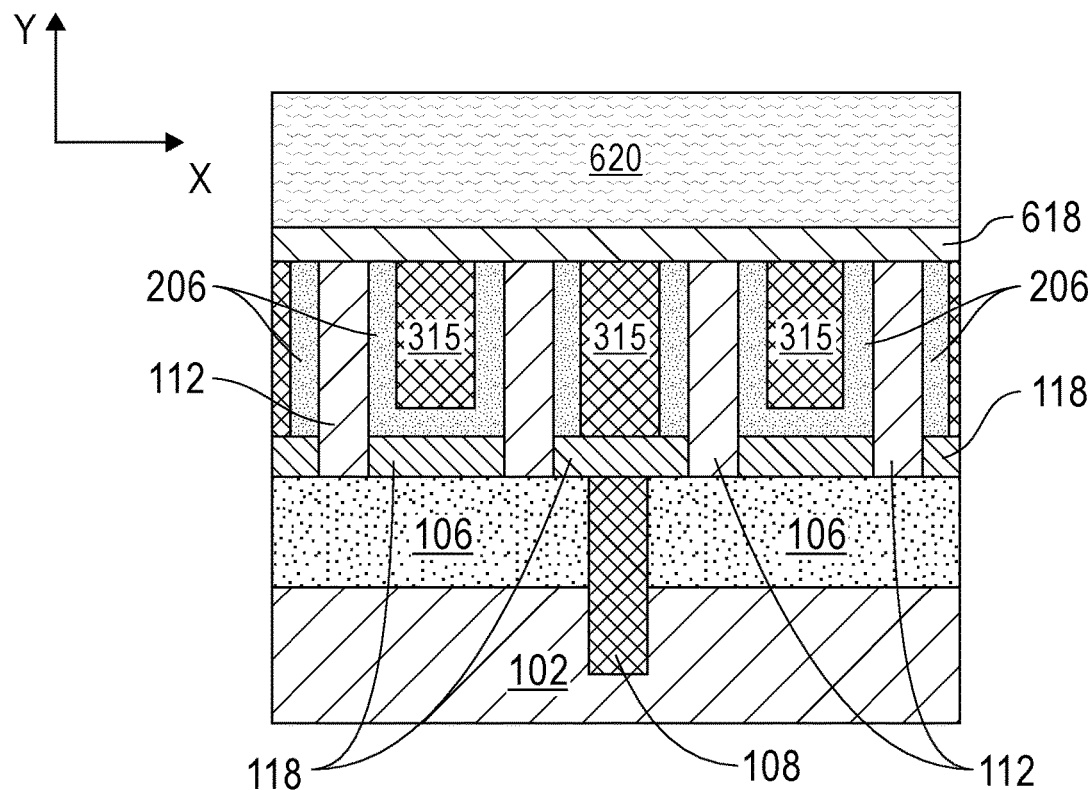
FIG. 6A is a cross-sectional view of the semiconductor structure after deposition of an amorphous semiconductor layer and a hard mask memorization layer, according to an embodiment of the present disclosure.
Figure 6B:
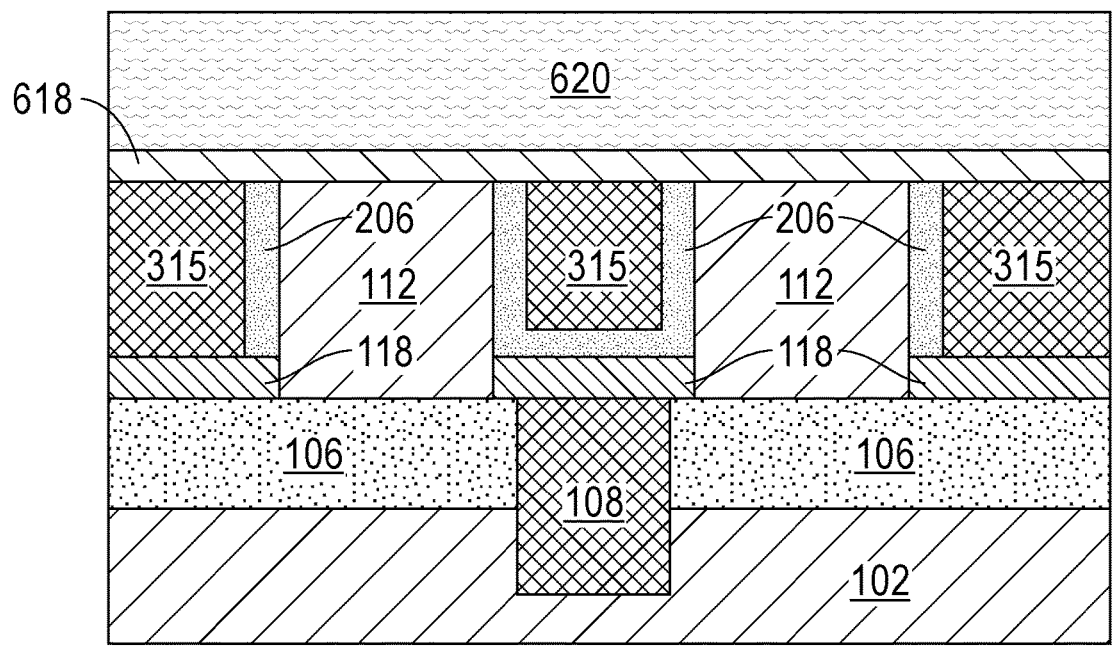
FIG. 6B is a lateral view of the semiconductor structure taken along the Y-plane.

Referring now to FIG. 6A, a cross-sectional view of the semiconductor structure 100 after deposition of an amorphous semiconductor layer 618 and a hard mask memorization layer 620 is shown, according to an embodiment of the present disclosure. In this embodiment, FIG. 6B is a lateral view of the semiconductor structure 100 taken along the Y-axis.

The amorphous semiconductor layer 618 may be deposited using standard deposition processes such as plasma-enhanced chemical vapor deposition (PECVD). A thickness of the amorphous semiconductor layer 618 may vary from approximately 5 nm to approximately 10 nm. It should be noted that the amorphous semiconductor layer 618 may include any amorphous semiconductor material which can be recrystallized later, and has etch selectivity between amorphous and recrystallized portions. In this embodiment, the amorphous semiconductor layer 618 includes amorphous silicon germanium (a-SiGe). In other embodiments, the amorphous semiconductor layer 618 includes amorphous silicon (a-Si).

The hard mask memorization layer 620 may be deposited above and in direct contact with the amorphous semiconductor layer 618. The function of the hard mask memorization layer 620 is to memorize the region for top S/D epi formation. Stated differently, the hard mask memorization layer 620 acts as a placeholder for the subsequently formed top S/D junction. Any suitable deposition process can be used to form the hard mask memorization layer 620. In this embodiment, the hard mask memorization layer 620 includes silicon carbide (SiC). In other embodiments, silicon oxycarbide (SiCO) or silicon nitride (SiN) can be used instead of silicon carbide. A thickness of the hard mask memorization layer 620 may vary from approximately 20 nm to approximately 60 nm.

Figure 7A:
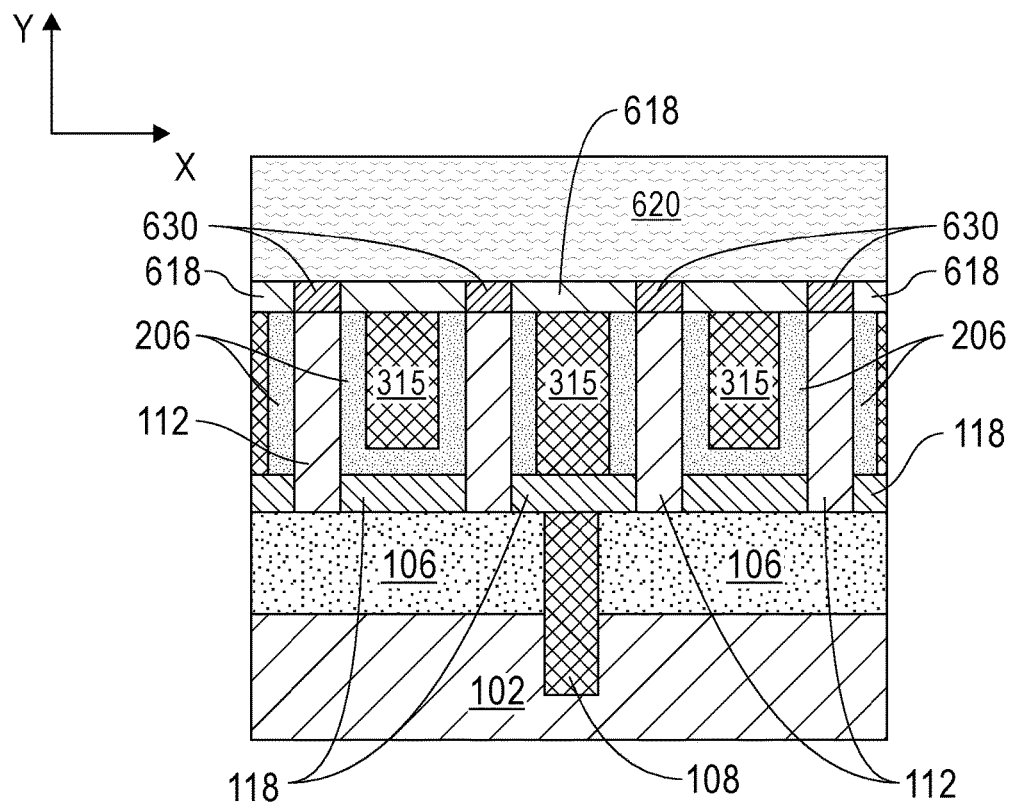
FIG. 7A is a cross-sectional view of the semiconductor structure after local recrystallization of the amorphous semiconductor layer, according to an embodiment of the present disclosure.
Figure 7B:
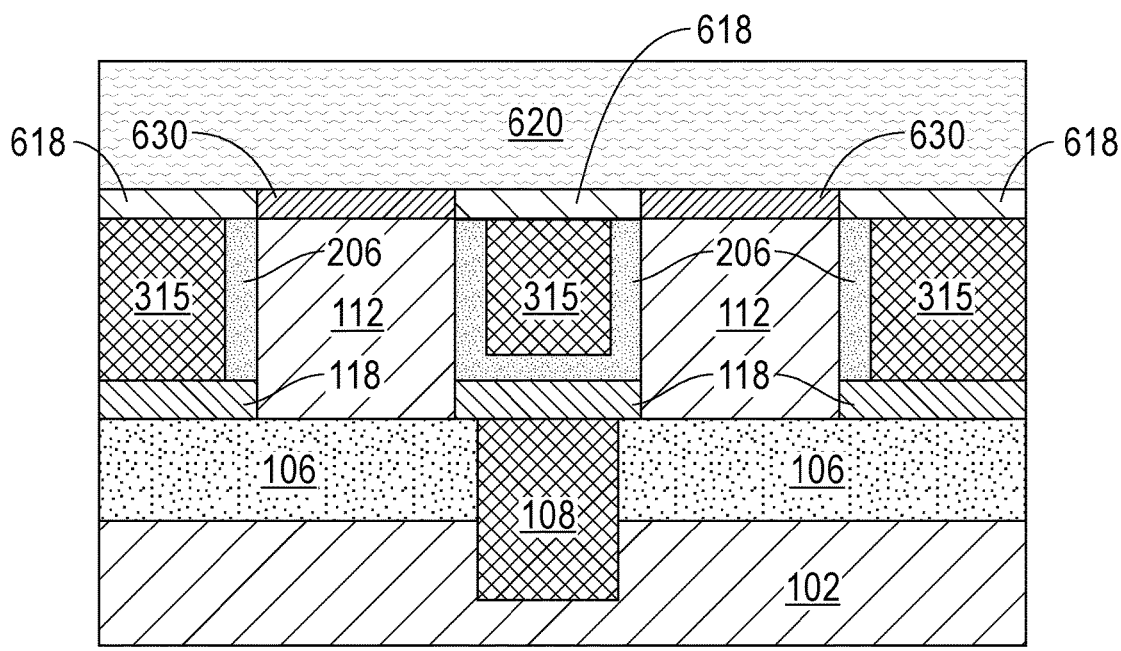
FIG. 7B is a lateral view of the semiconductor structure taken along the Y-plane.

Referring now to FIG. 7A, a cross-sectional view of the semiconductor structure 100 after local recrystallization of the silicon germanium layer 618 is shown, according to an embodiment of the present disclosure. In this embodiment, FIG. 7B is a lateral view of the semiconductor structure 100 taken along the Y-axis.

Local recrystallization of the amorphous semiconductor layer 618 occurs selectively on areas of the amorphous semiconductor layer 618 directly above the channel fin 112 forming recrystallized regions 630. Specifically, the selective formation of the recrystallized regions 630 occurs because portions of the amorphous semiconductor layer 618 in contact with the (single crystal film) channel fin 112 requires lower energy for the recrystallization process to happen. The recrystallized regions 630 may provide a self-aligned way to identify the position of the channel fin(s) 112 for top spacer formation.

According to an embodiment, the local recrystallization process can be achieved by thermal processes such as rapid thermal annealing (RTA), laser spike annealing (LSA), and the like.

Figure 8A:
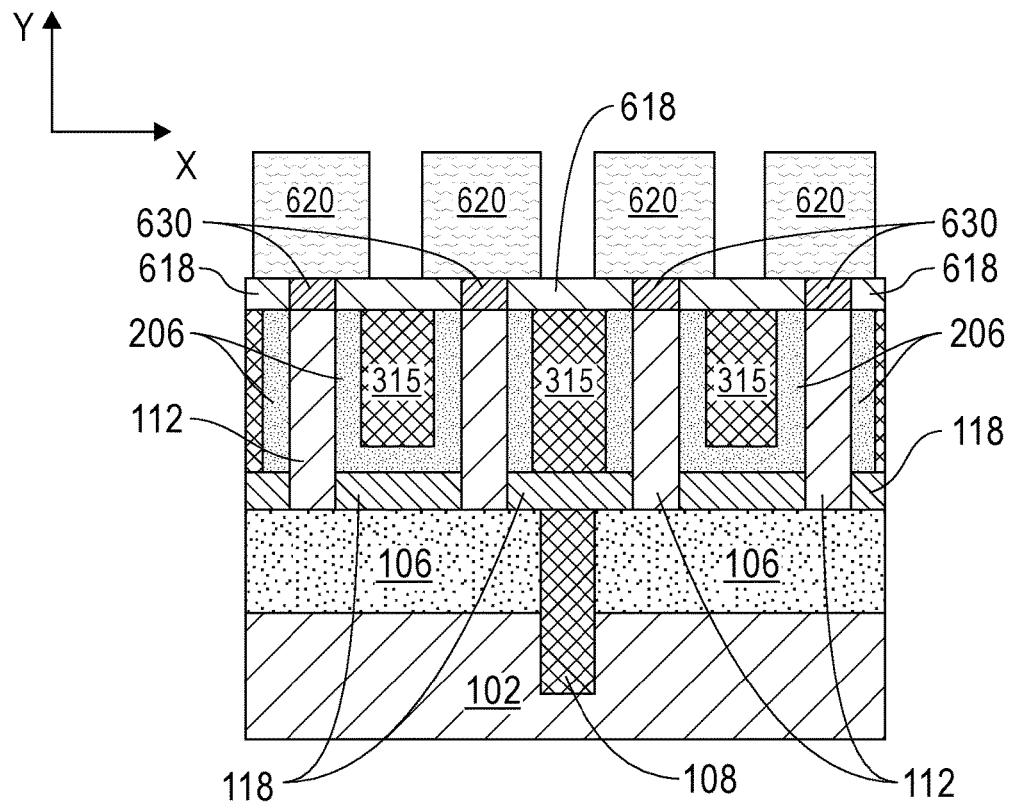
FIG. 8A is a cross-sectional view of the semiconductor structure after patterning of the hard mask memorization layer, according to an embodiment of the present disclosure.
Figure 8B:
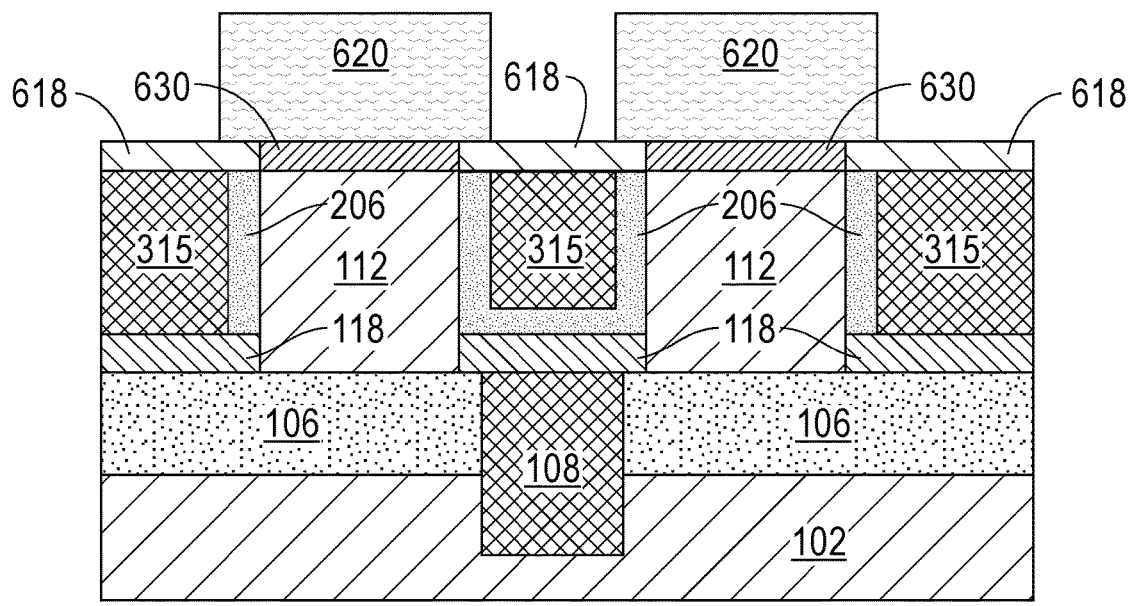
FIG. 8B is a lateral view of the semiconductor structure taken along the Y-plane.

Referring now to FIG. 8A, a cross-sectional view of the semiconductor structure 100 after patterning of the hard mask memorization layer 620 is shown, according to an embodiment of the present disclosure. In this embodiment, FIG. 8B is a lateral view of the semiconductor structure 100 taken along the Y-axis.

Figure 9A:
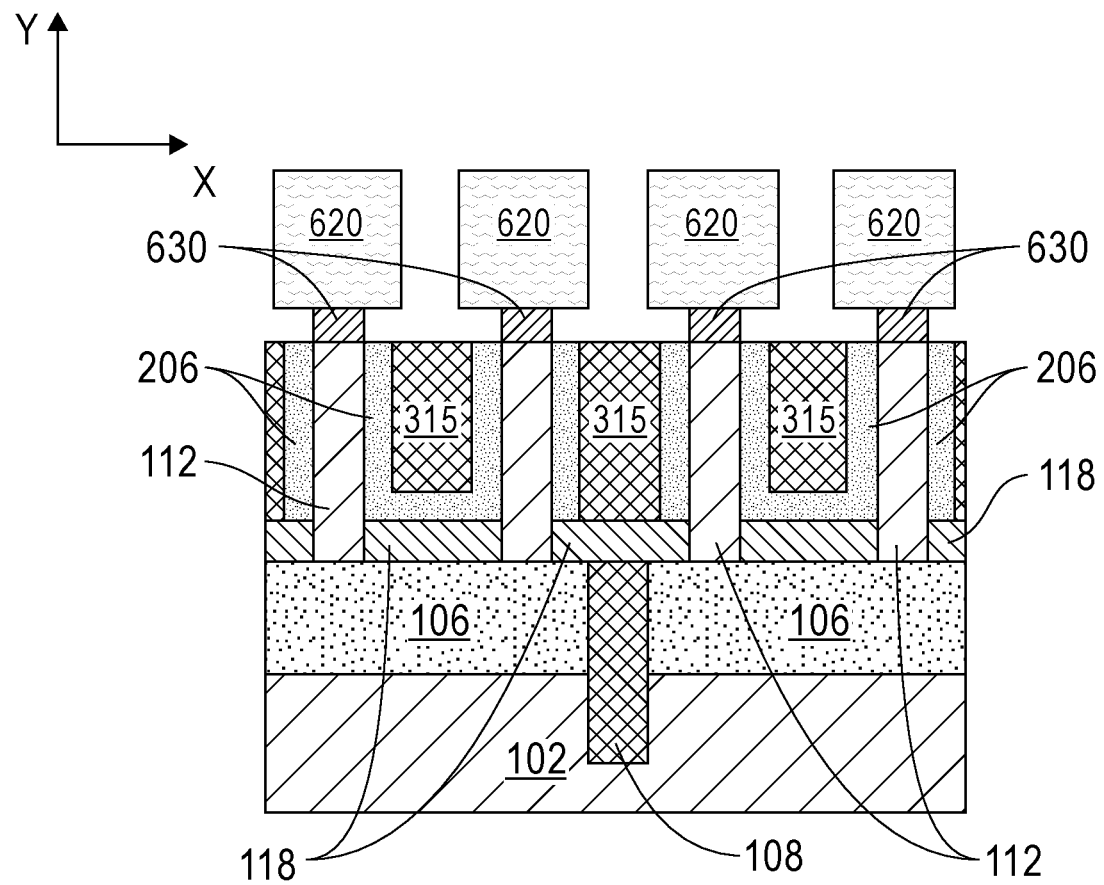
FIG. 9A is a cross-sectional view of the semiconductor structure depicting the removal of remaining portions of the amorphous semiconductor layer, according to an embodiment of the present disclosure.
Figure 9B:
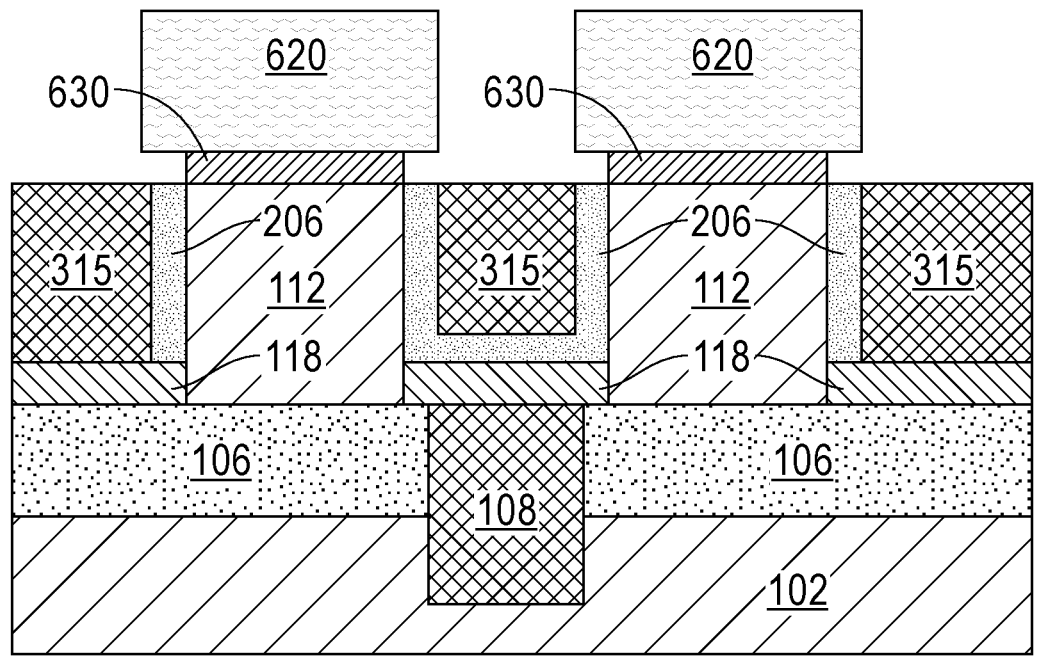
FIG. 9B is a lateral view of the semiconductor structure taken along the Y-plane.

According to an embodiment, standard lithographic patterning processes can be used to pattern the hard mask memorization layer 620. Patterning of the hard mask memorization layer 620 creates recesses that expose portions of the amorphous semiconductor layer 618. The recesses allow the selective removal of remaining portions of the amorphous semiconductor layer 618 adjacent to the recrystallized regions 630, as shown in FIGS. 9A-9B. It should be noted that the thickness of the amorphous semiconductor layer 618 determines a thickness of a subsequently formed top spacer, as will be described in detail below.

Figure 10A:
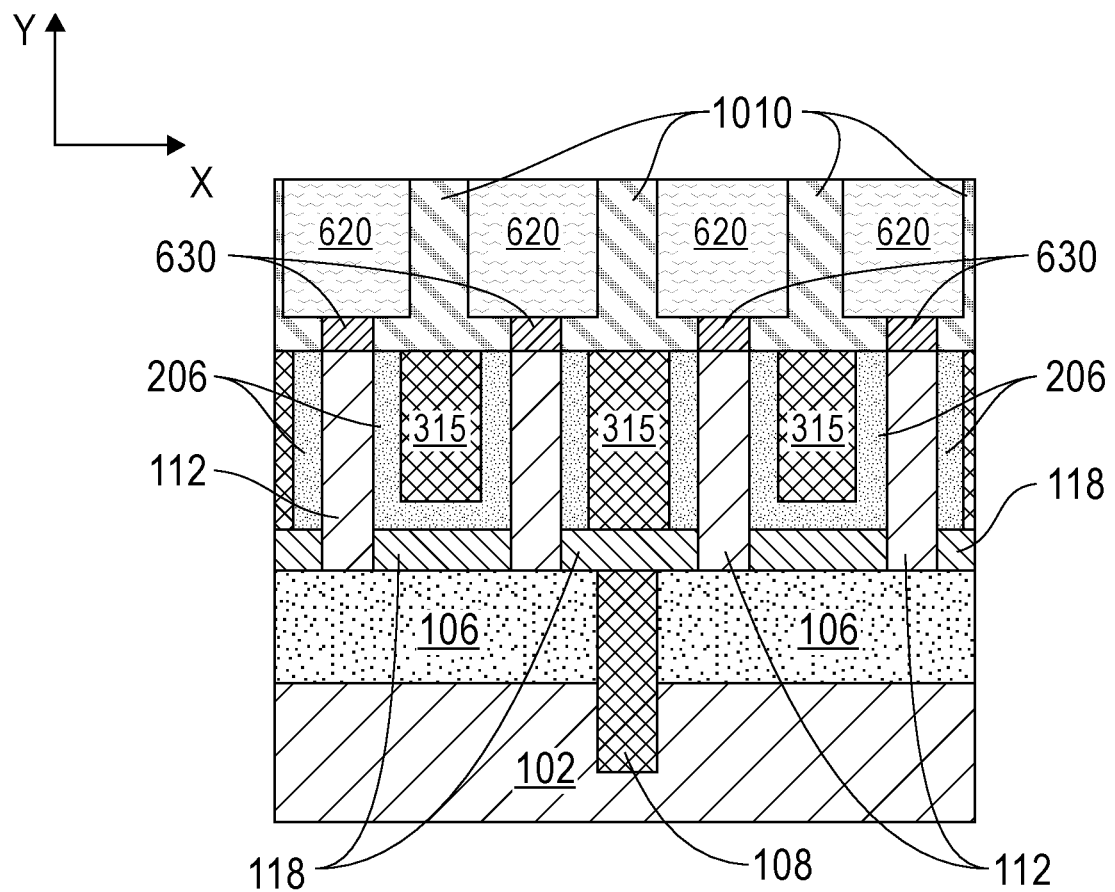
FIG. 10A is a cross-sectional view of the semiconductor structure after deposition and planarization of a second dielectric layer, according to an embodiment of the present disclosure.
Figure 10B:
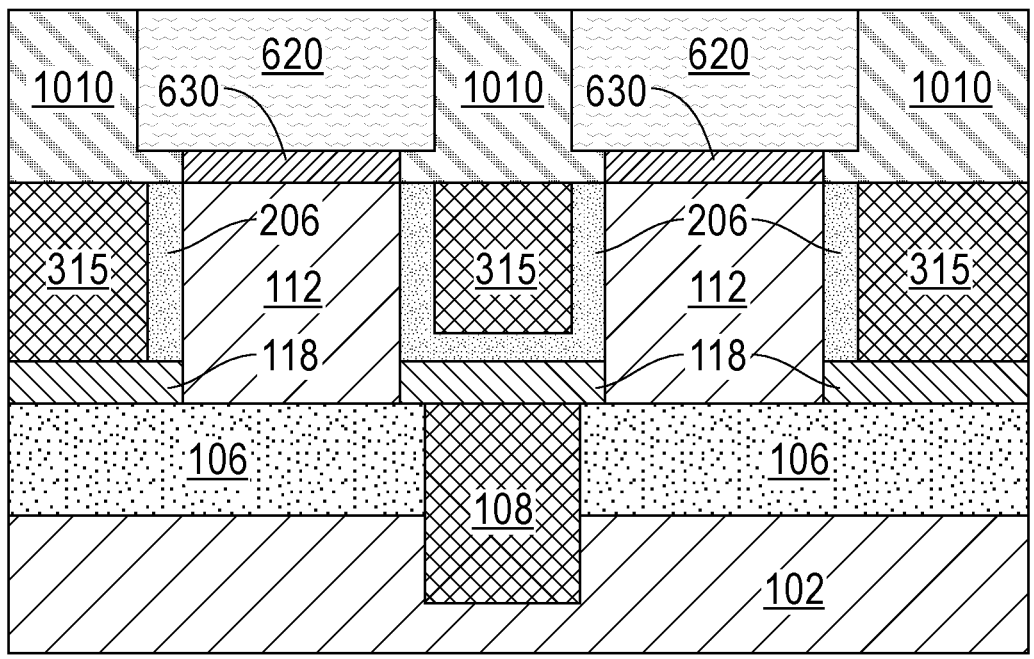
FIG. 10B is a lateral view of the semiconductor structure taken along the Y-plane.

Referring now to FIG. 10A, a cross-sectional view of the semiconductor structure 100 after deposition and planarization of a second dielectric layer 1010 is shown, according to an embodiment of the present disclosure. In this embodiment, FIG. 10B is a lateral view of the semiconductor structure 100 taken along the Y-axis.

The second dielectric layer 1010 may be made of analogous materials and formed in similar ways as the first dielectric layer 315. The second dielectric layer 1010 substantially fills all the openings created in the semiconductor structure 100 after the recessing of the hard mask memorization layer 620 and the removal of the amorphous semiconductor layer 618. As may be known by those skilled in the art, the second dielectric layer 1010 form a top spacer of the semiconductor structure 100. As can be observed, the thickness of the amorphous semiconductor layer 618 determines a bottom thickness of the top spacer (i.e., second dielectric layer 1010), this may also guarantee a substantially uniform top spacer region.

Figure 11A:
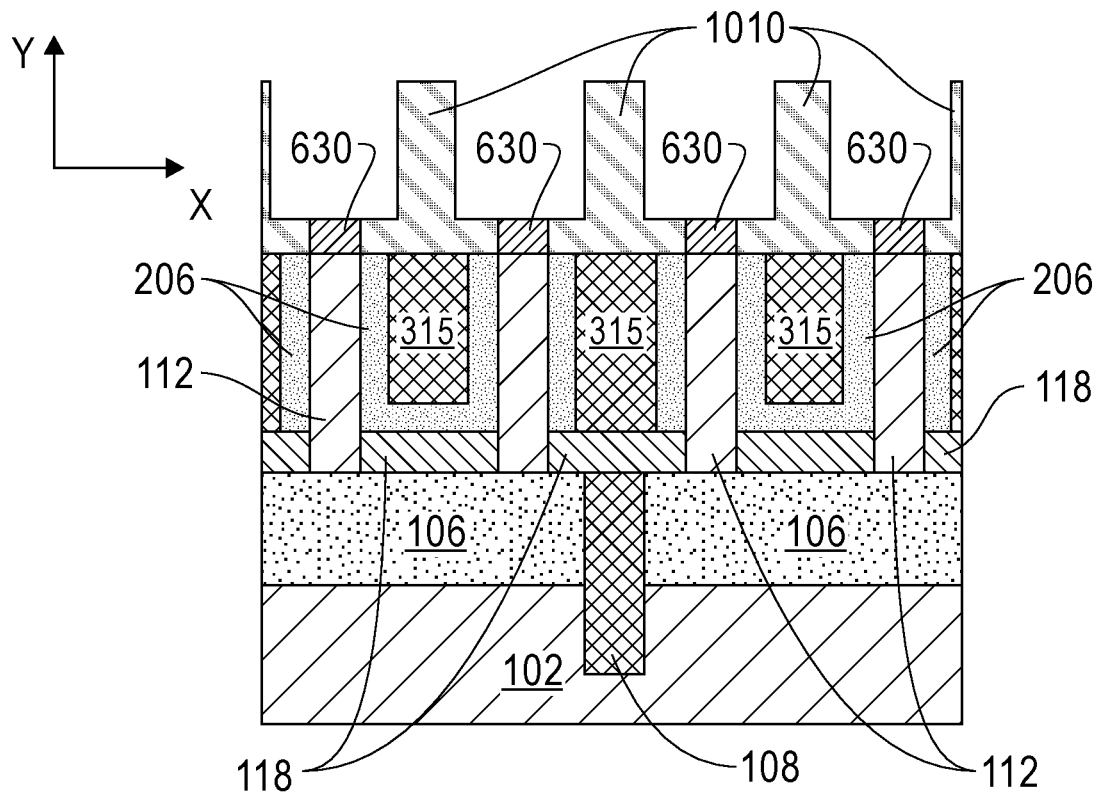
FIG. 11A is a cross-sectional view of the semiconductor structure after removing the hard mask memorization layer, according to an embodiment of the present disclosure.
Figure 11B:
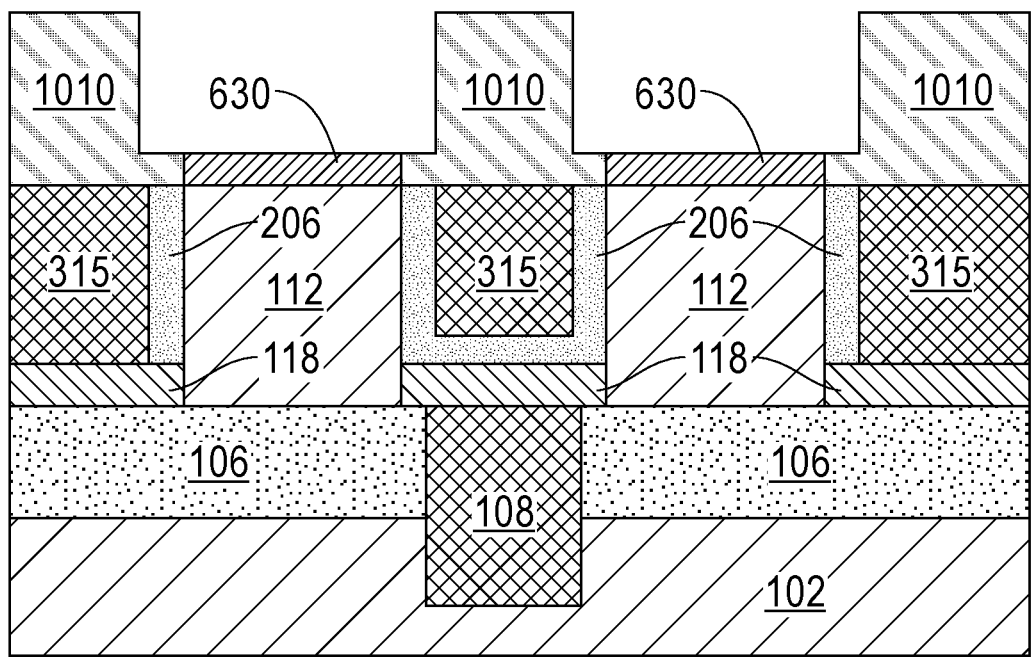
FIG. 11B is a lateral view of the semiconductor structure taken along the Y-plane.

Referring now to FIG. 11A, a cross-sectional view of the semiconductor structure 100 after removing the hard mask memorization layer 620 is shown, according to an embodiment of the present disclosure. In this embodiment, FIG. 11B is a lateral view of the semiconductor structure 100 taken along the Y-axis.

Standard etching techniques can be implemented to remove the hard mask memorization layer 620 from the semiconductor structure 100. Specifically, in an embodiment, a selective isotropic dry etch can be used to remove the hard mask memorization layer 620.

Figure 12A:
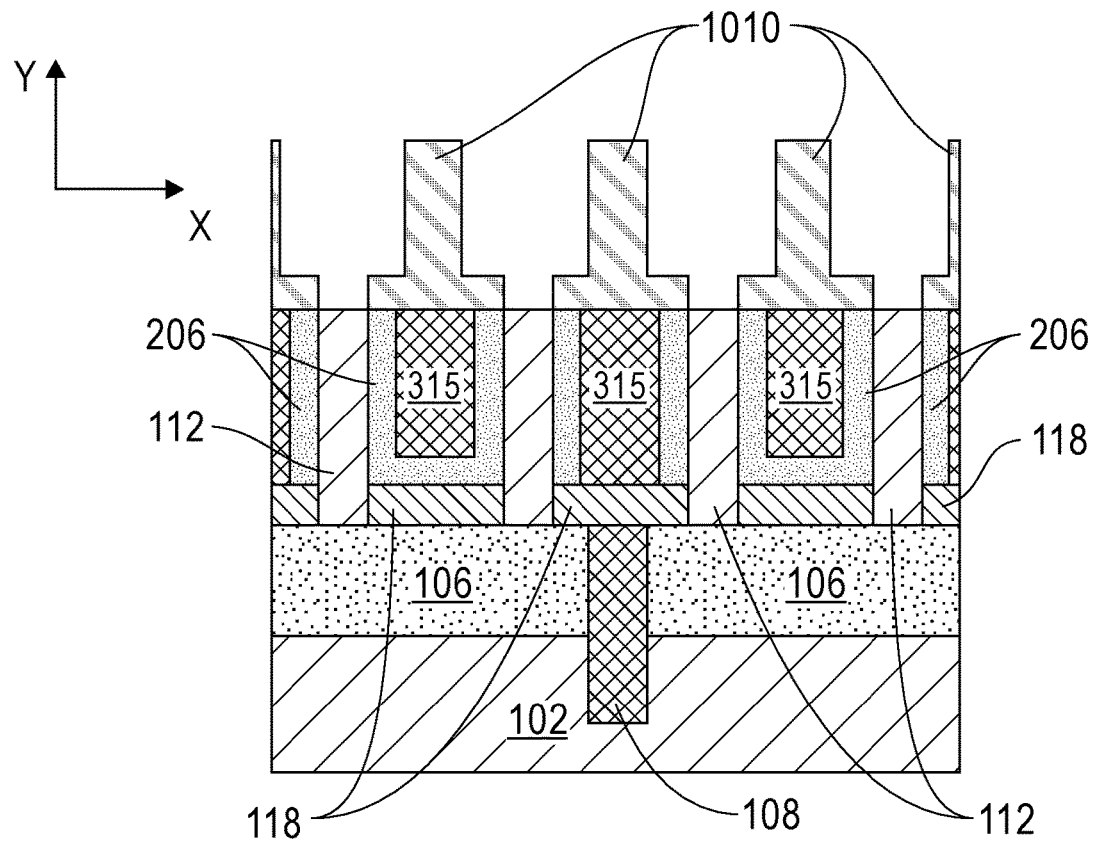
FIG. 12A is a cross-sectional view of the semiconductor structure after removing recrystallized regions, according to an embodiment of the present disclosure.
Figure 12B:
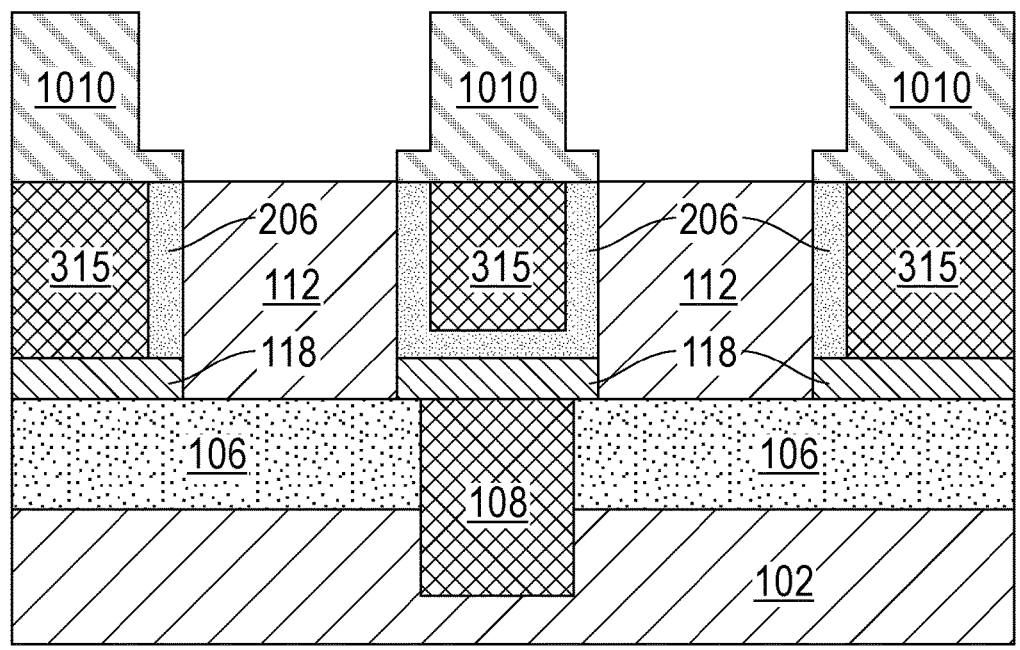
FIG. 12B is a lateral view of the semiconductor structure taken along the Y-plane.

After removal of the hard mask memorization layer 620, the recrystallized regions 630 are also removed from the semiconductor structure 100, as depicted in FIGS. 12A-12B. In an embodiment, a RIE process can be used to remove the recrystallized regions 630.

Figure 13A:
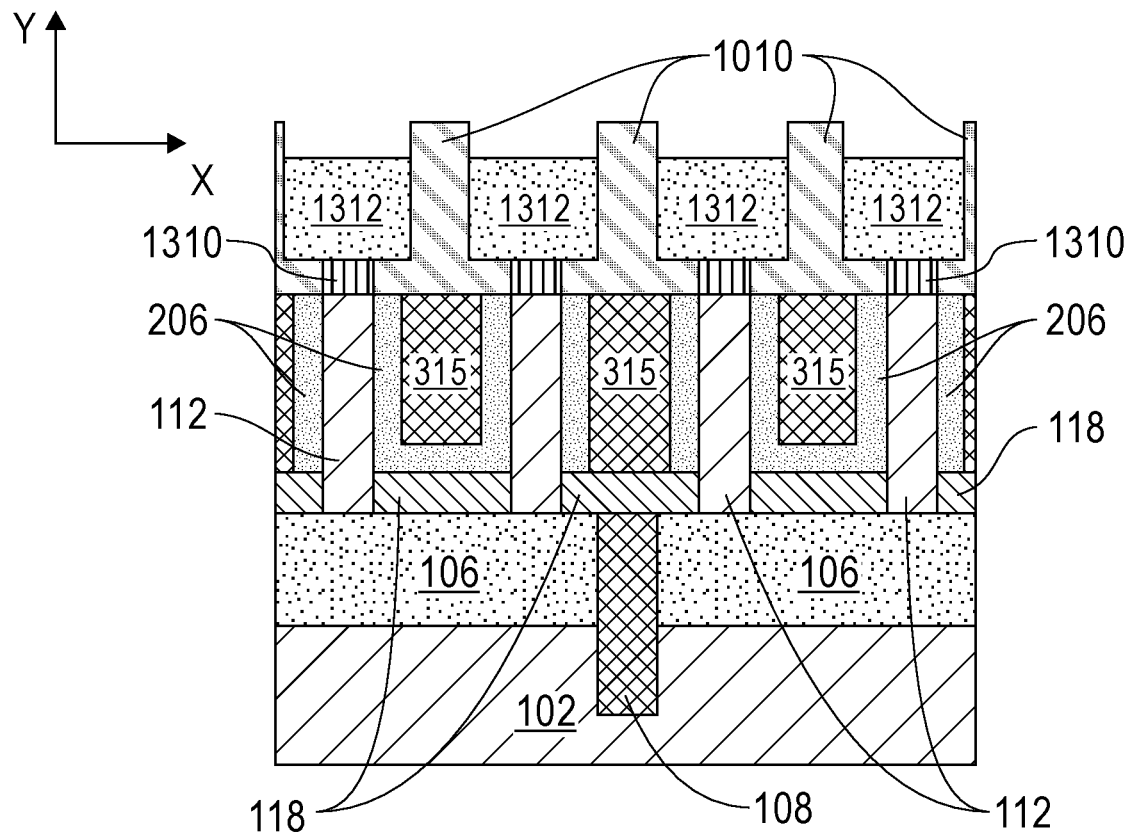
FIG. 13A is a cross-sectional view of the semiconductor structure after formation of first and second epitaxial regions, according to an embodiment of the present disclosure.
Figure 13B:
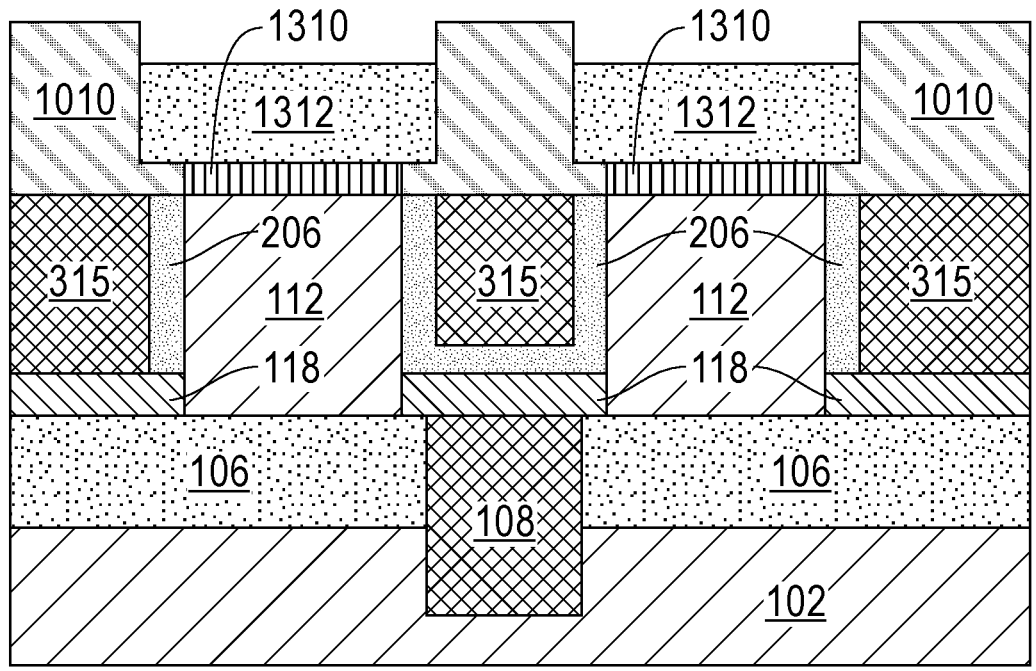
FIG. 13B is a lateral view of the semiconductor structure taken along the Y-plane.

Referring now to FIG. 13A, a cross-sectional view of the semiconductor structure 100 after formation of a first epitaxial region 1310 and a second epitaxial region 1312 is shown, according to an embodiment of the present disclosure. In this embodiment, FIG. 13B is a lateral view of the semiconductor structure 100 taken along the Y-axis.

The first epitaxial region 1310 is formed directly on top of an upper surface of the channel fin 112. The second epitaxial region 1312 is formed above the first epitaxial region in direct contact with the second dielectric layer 1010. The second epitaxial region 1312 substantially fills openings within the second dielectric layer 1010, as shown in the figures. In this embodiment, the first epitaxial region 1310 has a lower doping concentration than the second epitaxial region 1312.

As known by those skilled in the art, the first epitaxial region 1310 and the second epitaxial region 1312 can be formed by epitaxial growth by using the channel fin 112 as the seed layer. Terms such as "epitaxial growth and/or deposition" and "epitaxially formed and/or grown" refer to the growth of a semiconductor material on a deposition surface of a semiconductor material, in which the semiconductor material being grown has the same or substantially similar crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same or substantially similar crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Non-limiting examples of various epitaxial growth processes include rapid thermal chemical vapor deposition (RTCVD), low-energy plasma deposition (LEPD), ultra-high vacuum chemical vapor deposition (UHVCVD), atmospheric pressure chemical vapor deposition (APCVD), metalorganic chemical vapor deposition (MOCVD), low-pressure chemical vapor deposition (LPCVD), limited reaction processing CVD (LRPCVD), and molecular beam epitaxy (MBE). The temperature for an epitaxial deposition process can range from 500° C. to 900° C. Although higher temperatures typically results in faster deposition, the faster deposition may result in crystal defects and film cracking.

A number of different precursors may be used for the epitaxial growth of the first and second epitaxial regions 1310, 1312. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

According to an embodiment, the first epitaxial region 1310 and the second epitaxial region 1312 may include any p-type dopant use in the fabrication of a p-FET device, such as, for example, boron. For example, the dopant concentration of boron in the first epitaxial region 1310 may range from about 1e18 $cm^{-3}$ to about 1e20 $cm^{-3}$, while the dopant concentration of boron in the second epitaxial region 1312 may range from about 1e19 $cm^{-3}$ to about 9e21 $cm^{-3}$.

According to another embodiment, the first epitaxial region 1310 and the second epitaxial region 1312 may include any n-type dopant use in the fabrication of a n-FET device, such as, for example, phosphorus or arsenic. For example, the dopant concentration of phosphorous in the first epitaxial region 1310 may range from about $1\times10^{18}$ $cm^{-3}$ to about $1\times10^{20}$ $cm^{-3}$, while the dopant concentration of phosphorous in the second epitaxial region 1312 may range from about $1\times10^{19}$ $cm^{-3}$ to about $9\times10^{21}$ $cm^{-3}$.

The first epitaxial region 1310 and the second epitaxial region 1312 form the top S/D junction of the semiconductor structure 100. The lower doping concentration of the first epitaxial region 1310 may benefit junction formation (lower portion of top S/D junction) and better short channel effect, while the higher doping of the second epitaxial region 1312 may provide lower epi resistance. The top S/D junction or region formed by the first epitaxial region 1310 and the second epitaxial region 1312 is characterized by an asymmetrical t-shaped area in which the second epitaxial region 1312 has a horizontal thickness (or length) that is larger than a horizontal thickness of the first epitaxial region 1310. Additionally, as can be appreciated in FIG. 14A, a side "a" of the second epitaxial region 1312 may be larger than a side "b" of the second epitaxial region 1312, causing the asymmetric t-shaped configuration of the top S/D junction.

The first epitaxial region 1310 may have a (vertical) thickness ranging from about 5 nm to about 10 nm and ranges there between, although a thickness less than 5 nm or greater than 10 nm may be acceptable. The second epitaxial region 1312 may have a (vertical) thickness ranging from about 15 nm to about 40 nm and ranges there between, although a thickness less than 15 nm or greater than 40 nm may be acceptable.

Figure 14A:
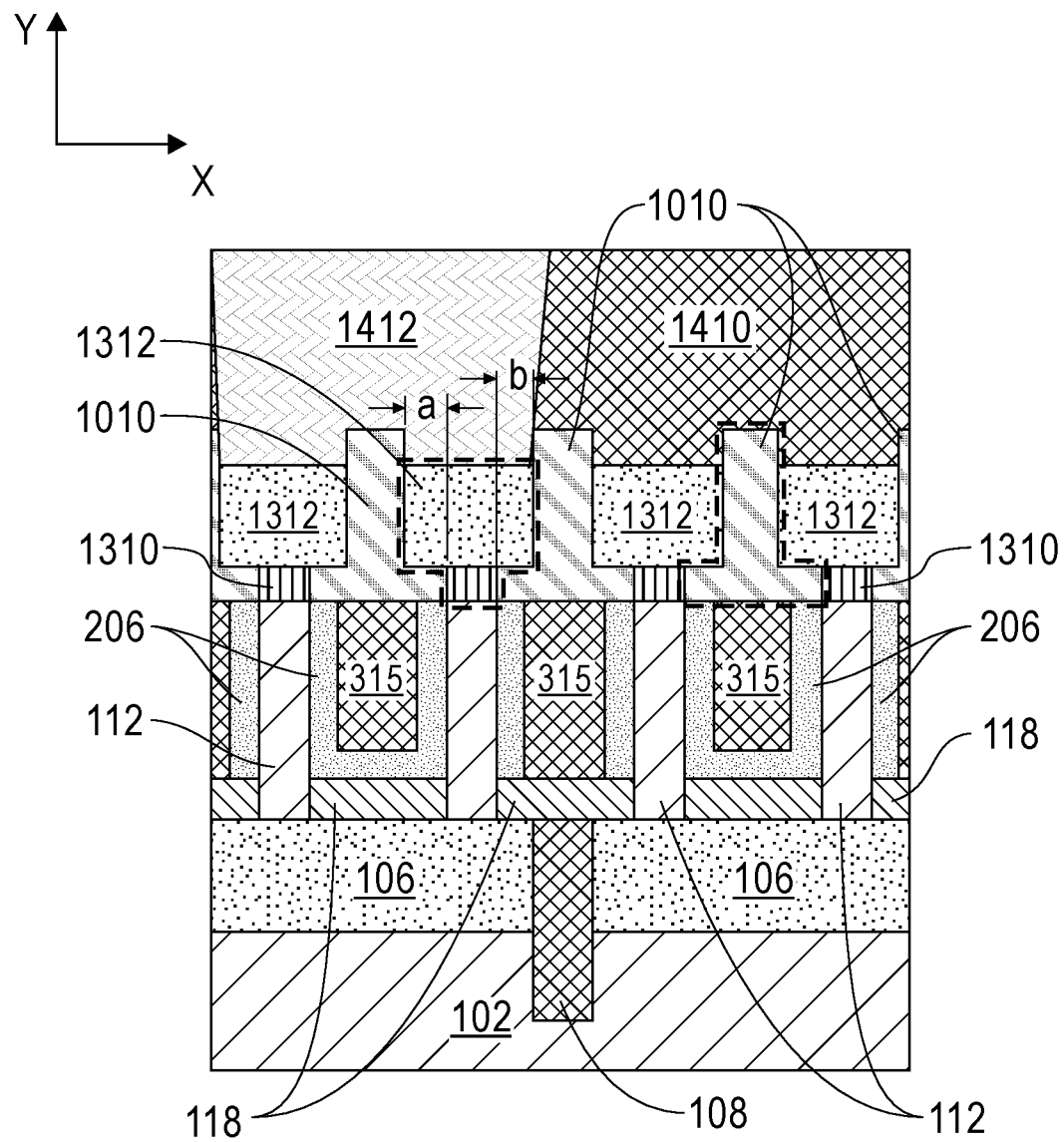
FIG. 14A is a cross-sectional view of the semiconductor structure after contact formation, according to an embodiment of the present disclosure.
Figure 14B:
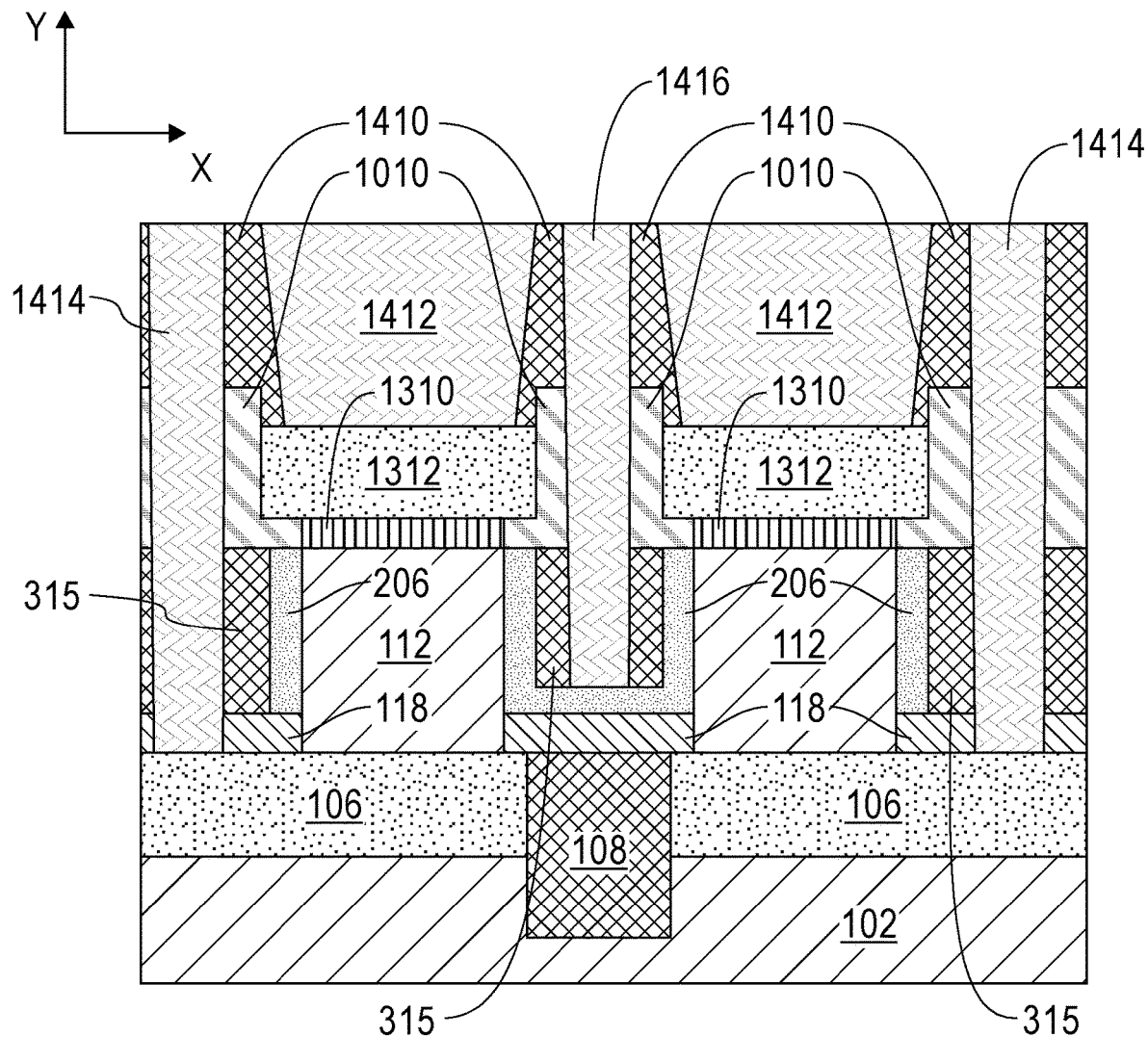
FIG. 14B is a lateral view of the semiconductor structure taken along the Y-plane.

Referring now to FIG. 14A, a cross-sectional view of the semiconductor structure 100 after contact formation is shown, according to an embodiment of the present disclosure. In this embodiment, FIG. 14B is a lateral view of the semiconductor structure 100 taken along the Y-axis.

As illustrated in the figure, source/drain contacts 1412, 1414 extends through the bottom S/D region 106 and the first epitaxial region 1310, respectively. The process of forming source/drain contacts is standard and well-known in the art. Typically, the process includes depositing a third dielectric layer 1410, forming trenches (not shown) within the third dielectric layer 1410 and subsequently filling the trenches with a conductive material or a combination of conductive materials to form the source/drain contacts 1412, 1414. The third dielectric layer 1410 may be made of analogous materials and formed in similar ways as the first dielectric layer 315. The conductive material filling the source/drain contacts 1412, 1414 includes a conductive metal, for example, aluminum (Al), platinum (Pt), gold (Au), tungsten (W), titanium (Ti), or any combination thereof. The conductive material may be deposited by a suitable deposition process, for example, CVD, PECVD, PVD, plating, thermal or e-beam evaporation, or sputtering. A planarization process, for example, CMP, is performed to remove any conductive material from surfaces of the semiconductor structure 100.

Gate contacts 1416 extend from a surface of the third dielectric layer 1410 through the second dielectric layer 1010 to the high-k metal gate stack 206. The process of forming the gate contacts 1416 is standard and well-known in the art. The process generally includes forming a trench (not shown) in the third dielectric layer 1410 and second dielectric layer 1010 to the high-k metal gate stack 206 using suitable etching processes, and filling the trench with a conductive material or a combination of conductive materials to form the gate contacts 1416. The conductive material forming the gate contacts 1416 may be a conductive metal, for example, aluminum (Al), platinum (Pt), gold (Au), tungsten (W), titanium (Ti), or any combination thereof deposited by a suitable deposition process, for example, CVD, PECVD, PVD, plating, thermal or e-beam evaporation, or sputtering. A planarization process, for example, CMP, is performed to remove any conductive material from surfaces of the semiconductor structure 100.

Therefore, embodiments of the present disclosure provide a method of forming top S/D junction using self-aligned recrystallization of an amorphous semiconductor material to accurately define the position of the top S/D junction and achieve a substantially uniform top spacer. Additionally, the resulting semiconductor structure (i.e., VFET device) exhibits a t-shaped top S/D junction composed of two epitaxial regions of different doping profile that provides better junction overlap. The smaller and less doped first epitaxial region 1310 is located on top of the channel fin 112 while the larger and more doped second epitaxial region 1312 is located on top of the first epitaxial region 1310. As can be observed in FIG. 14A, the second epitaxial region 1312 and the underlying first epitaxial region 1310 form the top S/D junction of the semiconductor structure 100, characterized by an asymmetric t-shape in which a side "a" is larger than a side "b" of the top S/D. Finally, the final semiconductor structure 100 includes an inverted t-shaped top dielectric region or top spacer (e.g., second dielectric layer 1010) adjacent to the top S/D junction. This inverted t-shaped dielectric region may have a uniform bottom thickness which is defined by the initial thickness of the amorphous semiconductor material, this may help avoiding the performance and yield degradation associated with non-uniform device junctions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
 a first epitaxial region in contact with a top surface of a channel fin extending vertically from a bottom source/drain located above a substrate;
 a second epitaxial region above the first epitaxial region, wherein the second epitaxial region has a horizontal thickness that is larger than a horizontal thickness of the first epitaxial region, the first epitaxial region and the second epitaxial region comprising a top source/drain region of the semiconductor structure, the first epitaxial region comprising a first doping concentration and the second epitaxial region comprising a second doping concentration that is lower than the first doping concentration; and
 a top spacer adjacent to the first epitaxial region and the second epitaxial region, the top spacer being in contact with a top surface of a high-k metal gate stack located around the channel fin and in contact with a top surface of a first dielectric layer disposed between adjacent channel fins.

2. The semiconductor structure of claim 1, wherein the top source/drain comprises an asymmetrical t-shape region.

3. The semiconductor structure of claim 1, wherein the top spacer comprises an inverted t-shape region.

4. The semiconductor structure of claim 1, further comprises:
 a bottom spacer above the bottom source/drain.

5. The semiconductor structure of claim 1, further comprises:
 source/drain contacts extending until a top surface of the bottom source/drain and through the first epitaxial region; and
 gate contacts extending from a surface of a third dielectric to the high-k metal gate stack.

* * * * *